United States Patent
Varieras

(10) Patent No.: US 11,303,017 B2
(45) Date of Patent: Apr. 12, 2022

(54) METHOD AND DEVICE FOR ESTIMATING THE SQUINT OF AN ANTENNA AND METHOD AND DEVICE FOR FOLLOWING THE POINTING OF AN ANTENNA IMPLEMENTING SUCH A METHOD AND DEVICE, BASED ON A HARMONIC ANALYSIS

(71) Applicant: SAFRAN DATA SYSTEMS, Courtaboeuf (FR)

(72) Inventor: Francois Varieras, Bretteville L'Orgueilleuse (FR)

(73) Assignee: SAFRAN DATA SYSTEMS, Courtaboeuf (FR)

( * ) Notice: Subject to any disclaimer, the term of this patent is extended or adjusted under 35 U.S.C. 154(b) by 61 days.

(21) Appl. No.: 16/643,182

(22) PCT Filed: Aug. 30, 2018

(86) PCT No.: PCT/EP2018/073384
§ 371 (c)(1),
(2) Date: Feb. 28, 2020

(87) PCT Pub. No.: WO2019/043117
PCT Pub. Date: Mar. 7, 2019

(65) Prior Publication Data
US 2020/0212564 A1    Jul. 2, 2020

(30) Foreign Application Priority Data

Aug. 30, 2017   (FR) ..................................... 1758000

(51) Int. Cl.
*H01Q 3/10*    (2006.01)
*G01S 13/68*   (2006.01)
(Continued)

(52) U.S. Cl.
CPC ............ *H01Q 3/10* (2013.01); *G01R 21/002* (2013.01); *G01R 21/1331* (2013.01); *G01S 13/68* (2013.01); *H04B 7/0617* (2013.01)

(58) Field of Classification Search
CPC .... H01Q 3/10; H01Q 3/2605; G01R 21/1331; G01R 21/002; G01S 13/68; H04B 7/0617
See application file for complete search history.

(56) References Cited

U.S. PATENT DOCUMENTS 2,638,585 A * 5/1953 Priest ........................ F41G 7/22
                                                        342/63
3,947,848 A * 3/1976 Carnahan .............. G01S 7/2813
                                                        342/16
(Continued)

FOREIGN PATENT DOCUMENTS

EP          0 507 440 A1   10/1992

OTHER PUBLICATIONS

International Search Report dated Nov. 2, 2018 in PCT/EP2018/073384 filed on Aug. 30, 2018, 3 pages.

*Primary Examiner* — Andrea Lindgren Baltzell
*Assistant Examiner* — Yonchan J Kim
(74) *Attorney, Agent, or Firm* — Oblon, McClelland, Maier & Neustadt, L.L.P.

(57) ABSTRACT

A calibrated measurement of the angular misalignment x of a radiofrequency antenna pointing towards a slow mobile, radio transmitter along an antenna axis, the antenna being in radio communication with the mobile. The measurement includes receiving of radiofrequency signals derived from the mobile during a period of the applied path, the signal being received on a frequency band lower than or equal to the frequency of the transmitted signal; determining, on a logarithmic scale, of the instantaneous power of the received signal; harmonic decomposition over each period of the power thus determined into a fundamental component and at (Continued)

least one harmonic component; and estimating of the angular misalignment x from the ratio between the fundamental term and a harmonic component.

7 Claims, 2 Drawing Sheets

(51) Int. Cl.
    *G01R 21/00* (2006.01)
    *G01R 21/133* (2006.01)
    *H04B 7/06* (2006.01)

(56) References Cited

U.S. PATENT DOCUMENTS

| | | |
|---|---|---|
| 5,093,649 A | 3/1992 | Johnson |
| 5,351,060 A | 9/1994 | Bayne |
| 6,741,837 B1 * | 5/2004 | Nakano ............... H04W 52/367 |
| | | 455/67.11 |
| 6,925,108 B1 * | 8/2005 | Miller ..................... G01S 7/023 |
| | | 375/132 |

* cited by examiner

METHOD AND DEVICE FOR ESTIMATING THE SQUINT OF AN ANTENNA AND METHOD AND DEVICE FOR FOLLOWING THE POINTING OF AN ANTENNA IMPLEMENTING SUCH A METHOD AND DEVICE, BASED ON A HARMONIC ANALYSIS

GENERAL TECHNICAL FIELD

The invention relates to a method and a device for accurately estimating the angular misalignment of a telecommunications receiving antenna. This information essentially allows making a decision on compliance with standards relating to the off-axis radiation when the antenna is also a transmitting antenna.

STATE OF THE ART

The ground telecommunications stations are in communication with mobile devices such as satellites via an antenna. This antenna must be correctly pointed towards the mobile to ensure good communication quality without disturbing the other users working in the same frequency band on the uplink.

During the communication, the mobile can drift, or the carrier on which the antenna lies can be movable and subjected to movements such that the antenna is no longer correctly pointed towards the mobile.

In addition to the degradation of the communication, such a misalignment can lead to receiving unwanted signals or disturb the communications relayed by adjacent communication devices or adjacent satellites when the antenna is also a transmitting antenna.

Also, there are solutions for, on the one hand, estimating the misalignment of the antenna and, on the other hand, repointing the antenna correctly in order to compensate for the estimated misalignment. In the latter case, it is about tracking the pointing or angle error measurement constituted as a control loop.

The most popular angular misalignment measurement, as it is the cheapest, is done by a technique called "Step-Track" or "Track While Scan". As such, reference may be made to documents U.S. Pat. No. 6,433,736 and U.S. Pat. No. 7,633,432.

This technique comprises the application to the antenna of a predefined low-amplitude misalignment movement ("dithering movement") around the anticipated direction of the transmitter (the satellite or the mobile). A receiver measures the variation in the level of the signal received along this path and, according to its profile, estimates a quantity proportional to the misalignment angle relative to this anticipated direction.

In this case, the simplest possible receiver is said to be "non-coherent" and directly calculates the instantaneous power of the signal received in its bandwidth without demodulating it.

The problem is that such a technique is very sensitive to the signal-to-noise ratio, it provides in particular a response whose scale factor or gain (ratio of the power response by the misalignment) depends on this value. Two major drawbacks for the antenna systems integrating this solution are encountered.

The first drawback is that it is not known how to determine whether the maximum pointing error allowable in accordance with the regulations to be able to transmit, has been exceeded. The equipment could then be denied the certifications required for it to be distributed in the market.

The second drawback is that a major error is made in the synthesis of the transfer function for the control loop of the tracking. At best, the tracking bandwidth is very reduced (gain lower than estimated), at worst the tracking becomes totally unstable and the equipment is unusable (gain higher than estimated).

These difficulties are increasingly critical because the new communication techniques (with spread spectrum, with increasingly sophisticated information coding) require operating with very weak or even negative signal-to-noise ratios (expressed in decibels). In this case, the value S/(S+N) deviates greatly from 1 and the gain is extremely reduced.

PRESENTATION OF THE INVENTION

The invention proposes to overcome the aforementioned drawbacks.

To this end, according to a first aspect, the invention proposes a method for estimating the angular misalignment x of an antenna pointing towards a satellite or a remote mobile along an antenna axis, the antenna being in radio communication with this mobile, the mobile transmitting on a continuous amplitude/phase modulated carrier by a message, in a given frequency band, the method comprising the following steps:
application of a predefined periodic movement to the antenna axis;
receiving of radiofrequency signals derived from the mobile during a period of the applied path, the signal being received on a frequency band lower than or equal to the frequency of the transmitted signal;
determination, on a logarithmic scale, of the instantaneous power of the received signal, said instantaneous power being obtained by means of the following steps:
filtering of the intermediate-frequency or baseband signal of all or part of the spectrum of the signal arriving from the mobile;
calculation of the rms voltage of the received radiofrequency signal or square law detection;
filtering of this rms voltage;
calculation of the logarithm of this filtered rms voltage;
harmonic decomposition over each period of the power thus determined into a fundamental component and at least one harmonic component;
estimation of the angular misalignment x from the ratio between the fundamental term and a harmonic component.

The invention is advantageously completed by the following characteristics, taken alone or in any of their technically possible combinations.

The harmonic component of interest is the harmonic component 2 (H2), the estimation of the angular misalignment x being obtained from the ratio of the fundamental component to the harmonic component 2.

The movement is like a sinusoid or a 2D-composition of elementary movements on 2 orthogonal axes, of sinusoidal preferably elliptical or Lissajous types.

According to a second aspect, the invention relates to a method for tracking the pointing of an antenna, a step of measuring the angular misalignment of the antenna by means of an estimation method according to the invention, said method comprising a step of:
comparing the misalignment to a threshold, and if the misalignment is greater than said threshold, the method comprising a step of stopping the transmission of the antenna towards the satellite if the antenna is also a transmitting antenna.

The method according to the second aspect of the invention may comprise a step of comparing the harmonic 2 with two threshold values, and if said harmonic 2 is comprised between said two threshold values, the method comprises a step of generating an instruction to move the antenna in order to cancel the estimated misalignment.

According to a third aspect, the invention relates to a device for accurately measuring the angular pointing error of an antenna comprising a processor configured to implement a method according to the first aspect of the invention.

According to a fourth aspect, the invention relates to a device for tracking the pointing of an antenna comprising a unit for controlling the antenna and a device for estimating the angular misalignment of the antenna according to the third aspect of the invention and comprising a processor configured to implement a method according to the second aspect of the invention.

PRESENTATION OF THE FIGURES

Other characteristics, objects and advantages of the invention will emerge from the following description, which is purely illustrative and not limiting, and which should be read in relation to the appended drawings in which.

In all of the figures, similar elements bear identical references.

DETAILED DESCRIPTION OF THE INVENTION

Figure 1:
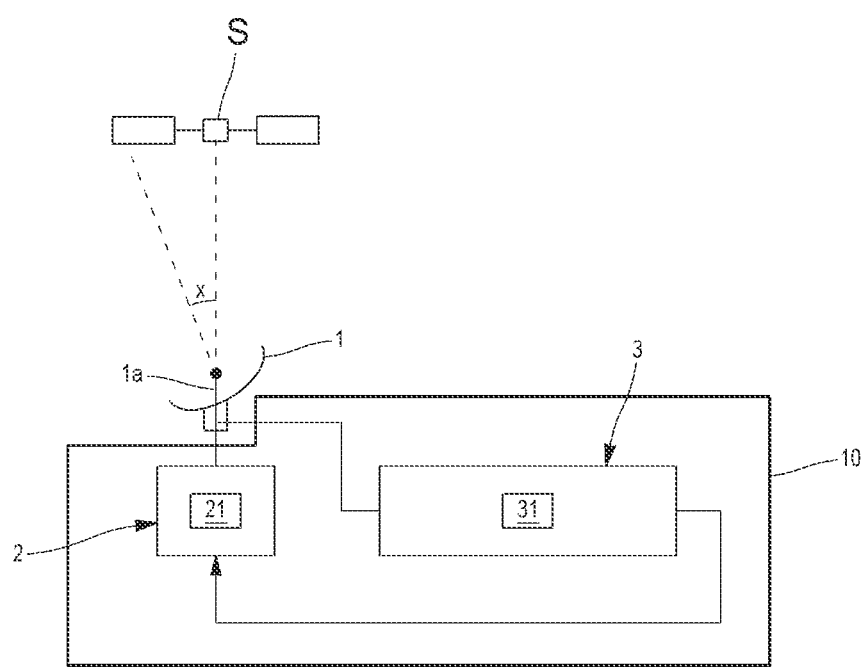
FIG. 1 illustrates a contextual diagram of the invention comprising a device for tracking the pointing of an antenna.

FIG. 1 illustrates a system for tracking the pointing of an antenna 1 towards a mobile communication device, for example a satellite S. The satellite S is typically geostationary and is typically a telecommunication satellite.

The communication mobile or satellite S advantageously transmits a radio signal on a continuous amplitude/phase modulated carrier (i.e. such that its transmission power is constant) by a random message, in a given frequency band.

The antenna 1 belongs to a ground station of known type.

It is considered that the antenna 1 points towards the satellite S along an antenna axis 1$a$. The antenna axis 1$a$ forms an angle x with the satellite S. This angle x is the angular misalignment of the antenna 1. The antenna axis 1$a$ is typically defined as the direction in the antenna reference frame where the gain of this antenna is maximum.

The antenna axis 1$a$ is motorized by a motor 2 which receives instructions from a device 3 for determining the pointing of the antenna.

The device 3 for determining the pointing of the antenna 1 is capable of estimating an angular misalignment of the antenna from which an instruction to point the antenna is generated to be communicated to the motor 21.

Figure 2:
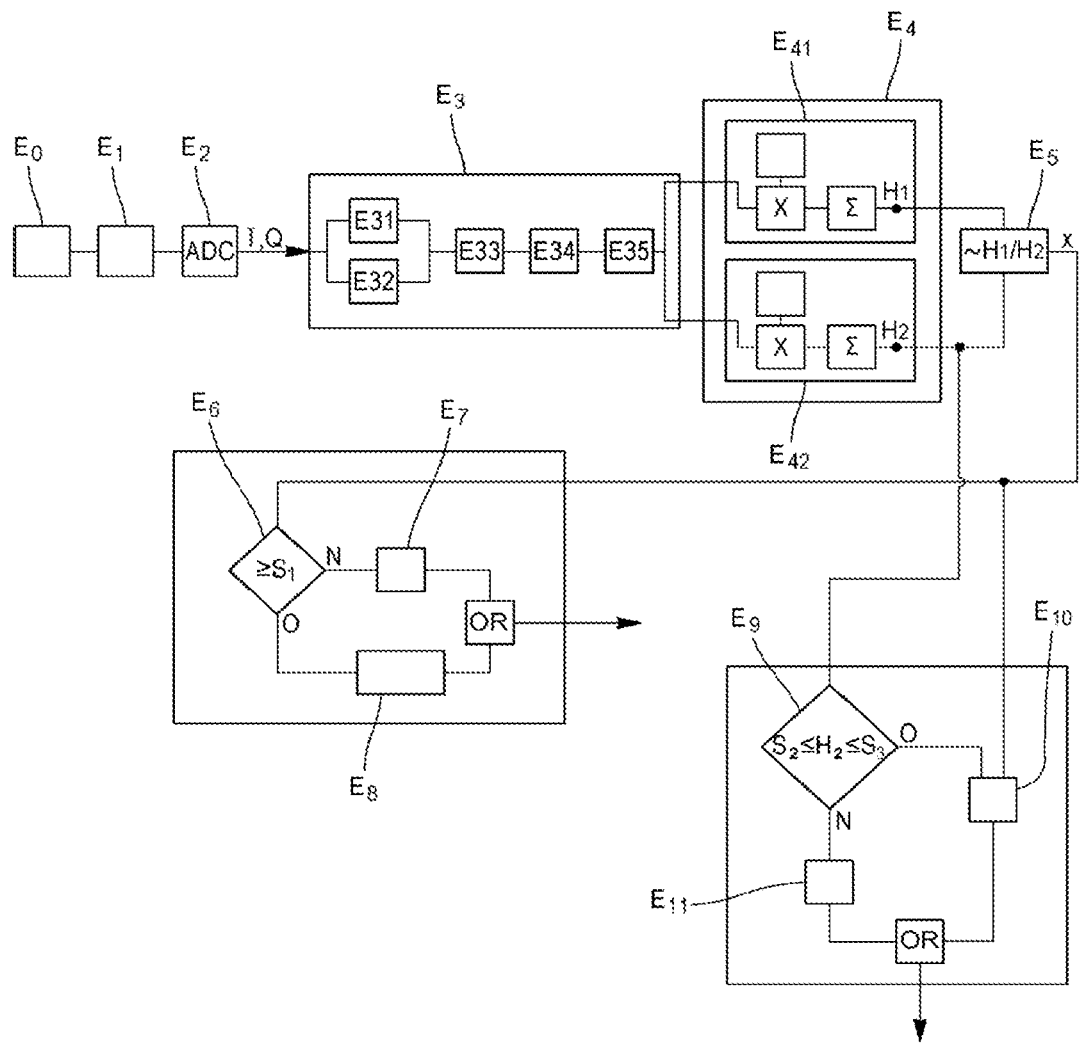
FIG. 2 illustrates steps of a method for determining the pointing of the antenna according to the invention.

Such a measurement device comprises a processor 31 configured to implement a method for estimating the misalignment and a method for tracking the pointing described in relation to FIG. 2.

In a preliminary step (step E0), a periodic misalignment and controlled kinematic movement is applied to the antenna axis 1$a$ via a unit 2 for controlling the antenna comprising a motor 21. This periodic path has an amplitude x1 and a pulsation $\omega$.

It can be a sinusoidal, ellipsoidal, etc. movement.

The antenna 1 receives (step E1) radiofrequency signals. The signals are received for a duration that corresponds to the period of the misalignment movement.

In addition, the signal is received on a frequency band lower than or equal to the frequency of the signal transmitted by the mobile. This makes it easier to recover the signal since the frequency spectrum corresponds to that of the transmission.

These received signals are converted (step E2) into complex signals of real and imaginary components respectively I and Q, which are digital, in baseband.

Then, a preprocessing (step E3) of the signals I and Q is carried out. At the end of this preprocessing step, the instantaneous power of the signal is obtained.

This preprocessing comprises an identical baseband filtering of each channel I & Q (steps E31 and E32), of width smaller than or equal to that of the received signals, then a measurement of the instantaneous rms voltage (step E33), then a video narrowband filtering (step E34) and finally a calculation (step E35) of the signal power defined in a logarithmic scale is carried out from this rms voltage.

The instantaneous power in decibels is a function of the logarithm of the rms voltage corresponding to a constant close to the logarithm of the logarithmic power (E35) of the filtered rms voltage:

Instantaneous power=20.log (rms voltage)=10.log (power)+constant.

The narrowband filtering is implemented by means of a filter having a cut-off frequency Fc, Fc being typically about ten Hertz to a few hundred Hertz (typically 100 Hz).

A harmonic decomposition of the power thus obtained is then carried out (step E4) so as to obtain a fundamental component Hi and at least one harmonic component 2 of interest noted H2, or even a DC component noted H0.

The harmonic decomposition is performed by calculating correlation products over a period between the detected power and the corresponding harmonic of the misalignment movement.

The DC component H0 is therefore obtained by calculating the average of the signal obtained at the end of the chain E3 over a period of the misalignment cycle. This average is representative of the average signal power received from the mobile.

The fundamental component H1 is obtained by calculating over a period the correlation product (step E41) between the signal obtained at the end of the chain E3 and the function having governed the movement of the antenna around the anticipated direction.

In the case of a sinusoidal movement applied to the antenna, the correlation is made with the function x1.sin($\omega$(t)).

The harmonic component 2 H2 is obtained by calculating the correlation product (step E42) between the power of the signal and the function cos(2.$\omega$(t)).

It is possible to additionally estimate the harmonics of higher orders such as H3, H4, etc., which potentially allows refining the accuracy of the misalignment calculation conducted in the next step.

Then, the angular error x is estimated (step E5) from the values of H0, H1 and H2, or even H3 or a higher order, whose values have been previously established by an analytical calculation as a function of the error x, the amplitude of periodic misalignment $x_1$, the width of the antenna lobe at −3 dB $x_0$ and the signal-to-noise ratio in the baseband S/N.

Particularly, these calculations show that the ratio of the components H1/H2 constitutes an estimator <x> of the error x independent of the value of the signal-to-noise ratio and of the width of the lobe, which allows carrying out in the simplest way the estimation step E5.

This estimate <x> can be compared to a threshold S1 (step E6). If the angular misalignment is greater than or equal to this threshold S1, then the stopping of the transmission of the antenna towards the mobile or the satellite is controlled (step E8) if the antenna is a transmitting antenna. Otherwise, the transmission continues (step E7). These decisions are communicated to the antenna control unit 2.

Alternatively or complementarily, the harmonic 2 H2 can be compared to two thresholds S2 and S3 (step E9). If the harmonic 2 H2 is comprised between the two thresholds (that is to say S2≤H2≤S3) then a re-pointing instruction −<x> is determined (step E10). Otherwise, no compensation is performed (step E11). Again, these decisions are communicated to the antenna control unit 2.

The instruction allows compensating for the calculated angular misalignment so that the antenna points correctly towards the satellite.

It is demonstrated below that the ratio $x/x_1$ is proportional to the quotient of the fundamental 1 and harmonic 2 components, linked to this quotient by a fixed constant depending only on the amplitude of the movement performed that is independent of the signal-to-noise ratio.

Namely an antenna 1 having dimensions greater than 10.λ (λ being the wavelength of the radiofrequency signals received by the antenna).

The antenna has an antenna gain:

$$G(\text{dB}) = G_0(\text{dB}) - 12.04\left(\frac{X}{x_0}\right)^2 = G_0(\text{dB}) + 10*\log\left[\exp\left(-2.77*\left(\frac{X}{x_0}\right)^2\right)\right]$$

with X=x+x1.sin(ω(t)) (describing the total path of the antenna).

By considering a periodic movement of equation x1.sinω(t) applied to the antenna 1 (the antenna being subjected to a movement x1.sinω(t)+x) we have $$G(\text{dB}) = G_0(\text{dB}) - 12.04\left(\frac{x + x1 \cdot \sin(\omega(t))}{x_0}\right)^2$$

By noting S as the average useful signal power received by the antenna pointed in the axis and N the fixed noise collected throughout the baseband, the average power of the received signal (in decibels) W(dB) obtained at the end of the pre-treatment step (step E2) is calculated, which is given by:

$W(\text{dB})=10*\log (N+S*\exp (-2.77*[(x+x_1*\sin (\omega t))/x_0]^2))$ $W(\text{dB})=\text{Cte}+10*\log [1+S/(S+N)*(\exp (-2.77* [(x+x_1*\sin(\omega t))/x_0]^2)-1)]$ If S<N and if the antenna movements are of small amplitude about its axis, then we have the approximation:

$W(\text{dB})=\text{Cte}+10/M*S/(S+N)*(\exp (-2.77*[(x+x_1*\sin (\omega t))/x_0]^2)^2)-1)$ $W(\text{dB})=\text{Cte}-12.04*S/(S+N)*[(x+x_1*\sin(\omega t))/x_0]^2$ $W(\text{dB})=\text{Cte}-12.04*S/(S+N)*[x^2+2x*x_1*\sin(\omega t))/x_0x_1^2/x_0^2\sin^2(\omega t)]$ $W(\text{dB})=\text{Cte}'-12.04*S/(S+N)*(x_1/x_0)^2*[2*x/x_1*\sin (\omega t)-\cos (2\omega t)/2]$ $M=\ln(10)=2.3$ Namely the expression of the fundamental term H1 given by the following expression $$H_1 = -\frac{S}{S+N} \cdot 12.04 \cdot \frac{2 \cdot x \cdot x_1}{x_0^2}$$

The harmonic 2 H2 is given by the correlation of the power of the received signal with a cosine term calculated over a period between 0 and 2π, namely:

$$H_2 = \frac{S}{S+N} \cdot 12.04 \cdot \frac{x_1^2}{2x_0^2}$$

The ratio $$\frac{H_1}{H_2} = -4\frac{x}{x_1}$$

is then obtained:

It is observed that the ratio between the fundamental and the harmonic 2 is independent of the signal-to-noise ratio. It is also noted that the ratio is independent of the used logarithmic conversion scale (Napierian, base 10, 2 or other . . . ). However, this proportionality is no longer accurate if the powers H1 and H2 have not been expressed by a logarithmic scale. The logarithmic conversion is therefore not used here according to an engineering convention but because it is a method that allows obtaining the correct misalignment value, without the need for calibration or determination of a proportionality gain, or correction of non-linearity.

Of course, these qualities remain valid for any type of path applied to the antenna 1 having a periodicity, whatever the size of the antenna lobe, the amplitude of the search movement x1, the axial pointing error x.

The estimator <x> is therefore defined by the following functional:

$$\langle x \rangle = -4 \cdot x_1 \cdot \frac{H_1}{H_2}$$

The invention claimed is:

1. A method for estimating an angular misalignment of an antenna pointing towards a satellite or a remote mobile along an antenna axis, the antenna being in radio communication with said remote mobile, the remote mobile transmitting on a continuous amplitude or phase modulated carrier by a message, in a given frequency band, the method comprising:
   applying a predefined periodic movement to the antenna axis;
   receiving a radiofrequency signal derived from the remote mobile for a duration which corresponds to a period of the applied movement, the radiofrequency signal being received on a frequency band lower than or equal to a frequency of the continuous amplitude or phase carrier;

determining, on a logarithmic scale, an instantaneous power of the received radiofrequency signal, said instantaneous power being determined by:
- filtering an intermediate-frequency or baseband signal of all or part of a spectrum of the radiofrequency signal arriving from the remote mobile;
- calculating a root mean square (rms) voltage of the received radiofrequency signal or square law detection;
- filtering the calculated rms voltage; and
- calculating a logarithm of the filtered rms voltage;

harmonic decomposing over each period of the instantaneous power into a fundamental component and at least one harmonic component; and estimating the angular misalignment defined by a ratio between the fundamental component over the at least one harmonic component.

2. The method according to claim 1, wherein the at least one harmonic component is a harmonic component 2, the angular misalignment being defined by a ratio of the fundamental component to the harmonic component 2.

3. The method according to claim 1, wherein the predefined periodic movement is a sinusoid or a 2D-composition of elementary movements on 2 orthogonal axes.

4. A method for tracking a pointing of an antenna, comprising:
- estimating the angular misalignment of the antenna with the method for estimating according to claim 1;
- comparing the estimated angular misalignment to a threshold; and
- when the estimated angular misalignment is greater than said threshold, stopping transmission of the antenna towards the satellite if the antenna is a transmitting antenna.

5. The method for tracking the pointing of an antenna according to claim 4, further comprising comparing the at least one harmonic component with two threshold values, and
- when said at least one harmonic component is comprised between said two threshold values, generating an instruction to move the antenna in order to cancel the estimated angular misalignment.

6. A device for measuring an angular misalignment of an antenna comprising a processor configured to implement a method according to claim 1.

7. A device for tracking a pointing of an antenna comprising a unit for controlling the antenna and the device for estimating the angular misalignment of the antenna according to claim 6.

* * * * *